United States Patent [19]

Hisaka

[11] Patent Number: 5,677,574

[45] Date of Patent: Oct. 14, 1997

[54] AIRBRIDGE WIRING STRUCTURE FOR MMIC

[75] Inventor: Takayuki Hisaka, Itami, Japan

[73] Assignee: Mitsubishi Denki Kabushiki Kaisha, Tokyo, Japan

[21] Appl. No.: 629,535

[22] Filed: Apr. 9, 1996

[30] Foreign Application Priority Data

Apr. 12, 1995 [JP] Japan ........................ 7-087220

[51] Int. Cl.$^6$ .................. H01L 23/48; H01L 23/52; H01L 29/40
[52] U.S. Cl. ........................ 257/776; 257/775
[58] Field of Search ..................... 257/776, 775, 257/773

[56] References Cited

U.S. PATENT DOCUMENTS

| | | |
|---|---|---|
| 3,890,636 | 6/1975 | Harada et al. ............ 257/776 |
| 4,807,002 | 2/1989 | Donzelli ................... 257/776 |
| 4,916,520 | 4/1990 | Kurashima ................ 257/776 |
| 4,933,743 | 6/1990 | Thomas et al. ........... 257/776 |
| 5,148,260 | 9/1992 | Inoue et al. .............. 257/776 |
| 5,461,259 | 10/1995 | Kitamura et al. ........ 257/776 |
| 5,530,290 | 6/1996 | Aiken et al. ............. 257/776 |
| 5,539,227 | 7/1996 | Nakano ................... 257/776 |

FOREIGN PATENT DOCUMENTS

| | | |
|---|---|---|
| 60-161675 | 8/1985 | Japan . |
| 61-43449 | 3/1986 | Japan . |
| 61-133645 | 6/1986 | Japan . |
| 62-65346 | 3/1987 | Japan . |
| 63-300542 | 12/1988 | Japan . |

*Primary Examiner*—Mahshid D. Saadat
*Assistant Examiner*—S. V. Clark
*Attorney, Agent, or Firm*—Leydig, Voit & Mayer, Ltd.

[57] ABSTRACT

An airbridge wiring structure includes a substrate having a surface; a first wiring layer disposed on the surface of the substrate; and a second wiring layer disposed partially on the surface of the substrate and including an airbridge wiring layer crossing the first wiring layer, the first and second wiring layers being electrically insulated from each other and separated by an air gap wherein the airbridge wiring layer includes at least one longitudinal groove.

28 Claims, 9 Drawing Sheets

AIRBRIDGE WIRING STRUCTURE FOR MMIC

FIELD OF THE INVENTION

The present invention relates to an airbridge wiring structure for a monolithic microwave integrated circuit (MMIC) in which two conductors cross without being electrically connected to each other.

BACKGROUND ART

Figure 12A:
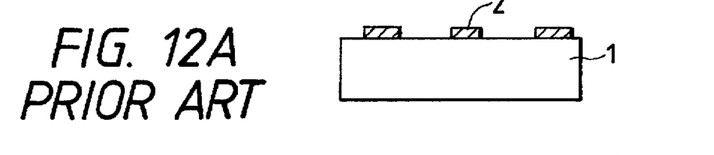
FIGS. 12A–12H are sectional views of steps in the manufacture of a conventional airbridge wiring structure.
Figure 12B:
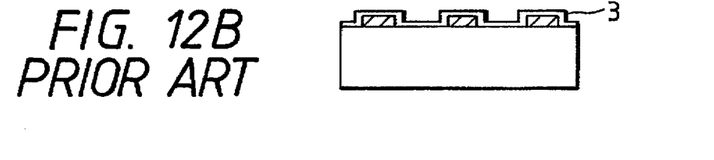
Figure 12C:
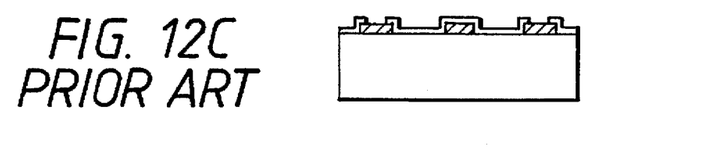
Figure 12D:
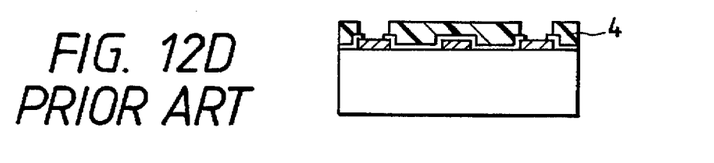

Airbridge wiring structures are conventionally employed in semiconductor integrated circuits, such as MMICs. In an airbridge structure, two conductors cross each other and are insulated from each other by an air gap having a lower dielectric constant than a solid material so that the capacitance between the two conductors is minimized. FIGS. 12A–12H are sectional views illustrating steps in manufacturing a conventional airbridge structure. In the conventional structure, a semiconductor substrate 1 has electrical conductors formed on it as a first wiring layer 2, as shown in FIG. 12A. An electrically insulating film 3, such as SiN, is deposited on the surface of the substrate covering the first wiring layer 2, as shown in FIG. 12B. Unneeded portions of the insulating film 3 are removed, for example, to expose parts of the first wiring layer 2 and between elements of that wiring layer 2, as shown in FIG. 12C.

Figure 12E:
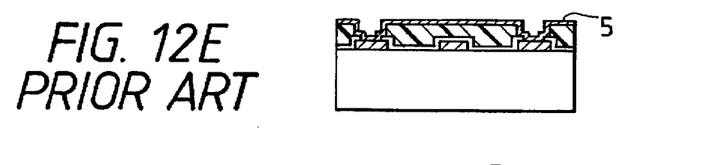
Figure 12F:
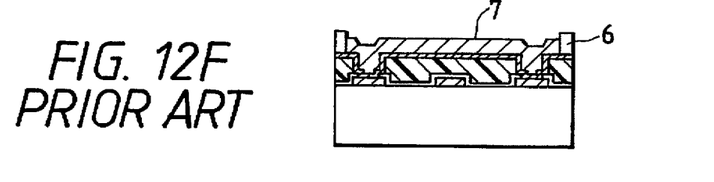
Figure 12G:
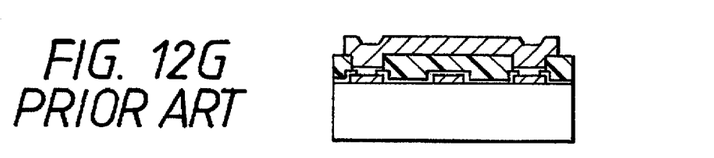
Figure 12H:
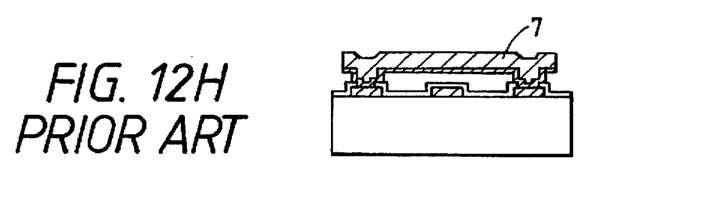

Thereafter, using conventional photolithographic techniques, a photoresist is deposited on the entire surface and patterned to produce the pattern 4 in which two elements of the lower wiring layer 2 are exposed. Then, a Ti/Au electrically conducting layer 5, for example, used as a feeding layer, is deposited by sputtering, as shown in FIG. 12E. Next, a second resist layer is deposited and patterned to form the upper resist layer 6 to limit the area over which an Au layer 7 is deposited by electrolytic plating. As shown in FIG. 12F, the gold layer is relatively thick and is plated on the portions of the feeding layer 5 that are not covered by the upper resist layer 6. After the gold plating step, the second resist layer 6 is removed. Exposed and unnecessary parts of the feeding layer 5 are removed by ion milling, producing the structure shown in FIG. 12G. Finally, the first resist layer 4 is removed, leaving an air gap between an airbridge wiring 7 and underlying parts of the first wiring layer 2 to produce the completed structure of FIG. 12H.

Since, in the conventional airbridge structure, there is an air gap between the airbridge wiring layer 7 and the substrate 1, any force applied to the airbridge wiring layer 7 in the direction of the substrate 1 meets little mechanical resistance. Moreover, if the airbridge wiring layer 7 extends between supports along a distance of at least 100 micrometers, the weight of the airbridge wiring layer 7 itself can deform the layer after the first resist layer 4 is removed. When, as a result of this sagging, the airbridge wiring layer 7 is broken, the electrical connection provided by the airbridge is opened. In addition, the airbridge wiring may contact the first wiring layer, resulting in destruction of the integrated circuit.

SUMMARY OF THE INVENTION

The present invention is directed to an improved airbridge wiring structure with higher reliability. It is an object of the invention to provide an improved airbridge wiring structure that, if broken, does not easily short circuit a first wiring layer. It is yet another object of the invention to provide an airbridge wiring structure having increased mechanical strength, that does not sag, and that resists deformation in response to mechanical forces.

In accordance with a first aspect of the invention, an airbridge wiring structure includes a substrate having a surface; a first wiring layer disposed on the surface of the substrate; and a second wiring layer disposed partially on the surface of the substrate and including an airbridge wiring layer crossing the first wiring layer, the first and second wiring layers being electrically insulated from each other and separated by an air gap wherein the first wiring layer has a first thickness opposite the airbridge wiring layer and a second thickness elsewhere.

In accordance with a second aspect of the invention, an airbridge wiring structure includes a substrate having a first surface; a first wiring layer disposed on the first surface of the substrate; and a second wiring layer disposed partially on the first surface of the substrate and including an airbridge wiring layer crossing the first wiring layer, the first and second wiring layers being electrically insulated from each other and separated by an air gap wherein the substrate includes a recess in which the first surface is a bottom surface of the recess, and the substrate includes a second surface outside the recess, the recess providing protection to the air bridge wiring structure.

According to a third aspect of the invention, an airbridge wiring structure includes a substrate having a surface; a first wiring layer disposed on the surface of the substrate; and a second wiring layer disposed partially on the surface of the substrate and including an airbridge wiring layer crossing the first wiring layer, the first and second wiring layers being electrically insulated from each other and separated by an air gap wherein the airbridge wiring layer includes at least one longitudinal groove.

According to a fourth aspect of the invention, an airbridge wiring structure includes a substrate having a surface; a first wiring layer disposed on the surface of the substrate; and a second wiring layer disposed partially on the surface of the substrate and including an airbridge wiring layer crossing the first wiring layer, the first and second wiring layers being electrically insulated from each other and separated by an air gap wherein the airbridge wiring layer includes a plurality of holes opposite the first wiring layer.

According to a fifth aspect of the invention, an airbridge wiring structure includes a substrate having a surface; an electrically conducting region within a portion of and at the surface of the substrate; and a wiring layer partially disposed on the surface of the substrate and including an airbridge wiring layer crossing the region wherein the region and the airbridge wiring layer are separated by an air gap.

In the above aspects, an insulating layer may be provided between the substrate and the first wiring substrate.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the same elements are given the same reference numbers.

DETAILED DESCRIPTION OF PREFERRED EMBODIMENTS

Figure 1A:
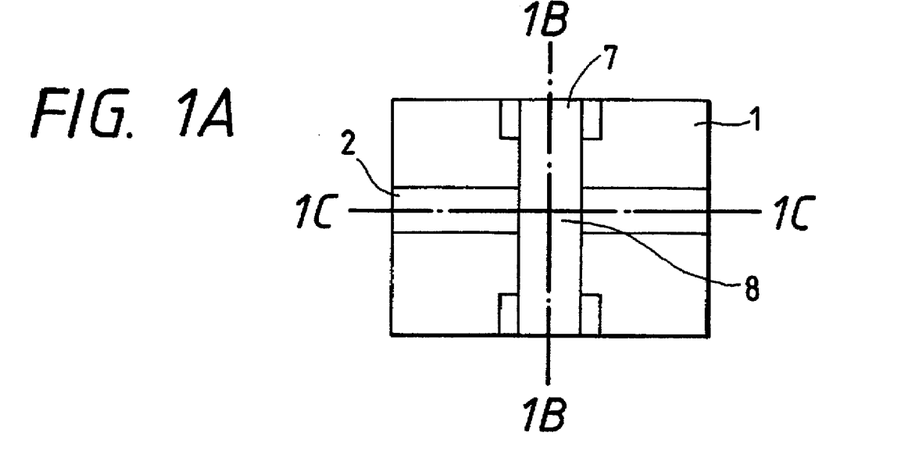
FIGS. 1A, 1B, and 1C are, respectively, a plan view and two sectional side views of an airbridge wiring structure according to an embodiment of the invention.
Figure 1B:
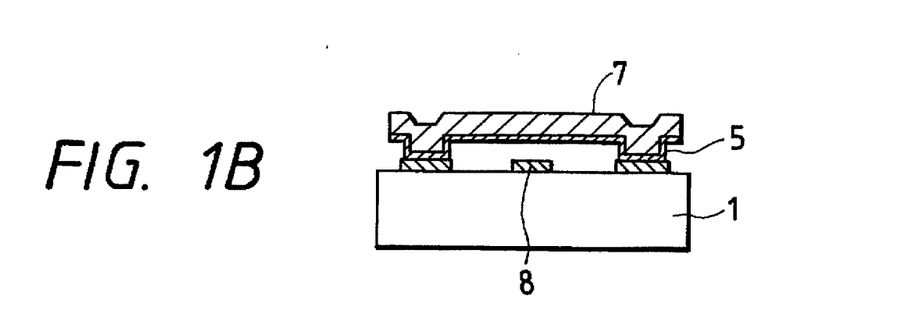
Figure 1C:
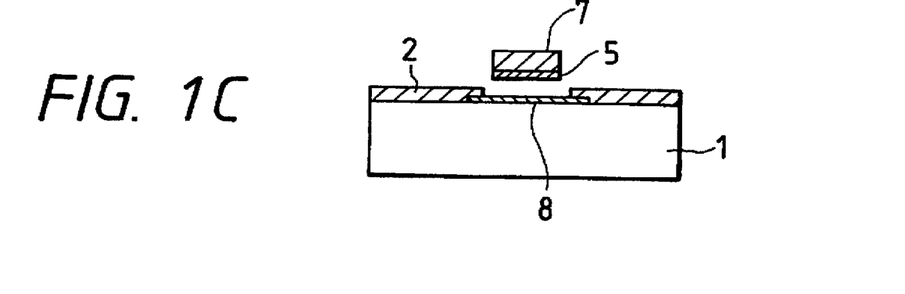

FIGS. 1A, 1B, and 1C are, respectively, a plan view and sectional side views taken along lines 1B—1B and 1C—1C of FIG. 1A. In these figures, a first wiring layer 8 is disposed on a surface of a substrate 1. Although not shown in these figures, an electrically insulating protection film, such as SiN, is normally disposed on the surface of the substrate, conforming to and covering the first wiring layer 8, as described in connection with FIG. 12B. As shown in FIG. 1C, the first wiring layer 8 is thinner opposite the airbridge wiring layer 7 than elsewhere, for example, only about 0.3 micrometers opposite the airbridge wiring layer 7 and 2 micrometers elsewhere. The airbridge wiring layer 7 may have a thickness of about 3 microns. In this embodiment of the invention, an air gap between the airbridge wiring layer 7 and the first wiring layer 8 is larger than in the conventional airbridge wiring structure. Therefore, even if the airbridge wiring layer 7 breaks, the airbridge wiring layer 7 does not readily contact the first wiring layer 8, preventing short circuiting. Moreover, this structure can easily be produced merely by changing a mask employed in forming the first wiring layer 8 so that no additional manufacturing steps are required.

Figure 2A:
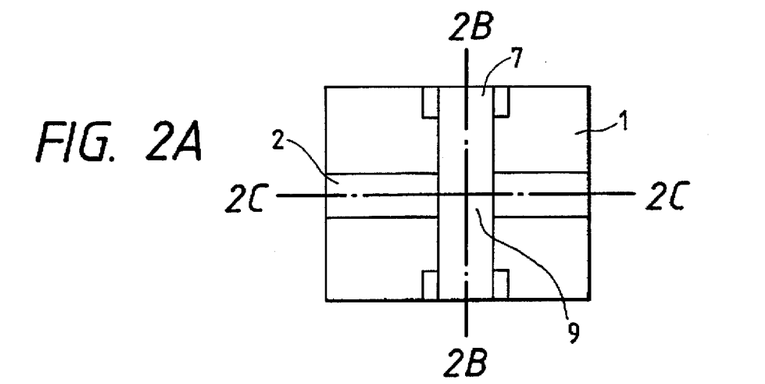
FIGS. 2A, 2B, and 2C are, respectively, a plan view and two sectional side views of an airbridge wiring structure according to an embodiment of the invention.
Figure 2B:
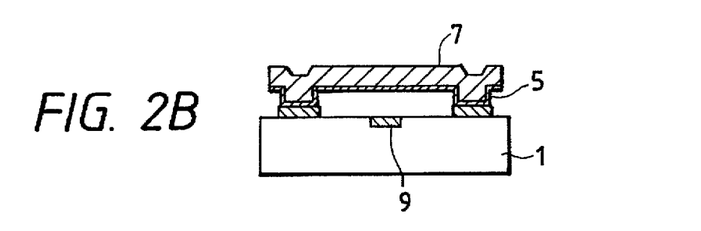
Figure 2C:
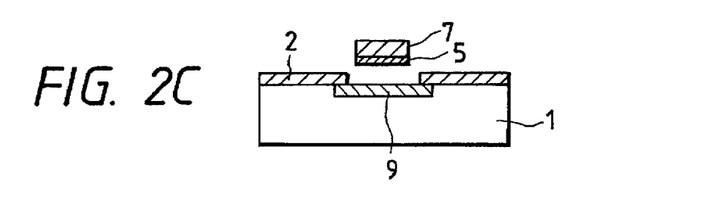

FIGS. 2A, 2B, and 2C are, respectively, a plan view and sectional views taken along lines 2B—2B and 2C—2C of FIG. 2A. In this embodiment, the substrate 1 includes an electrically conductive region 9 functioning as a conductive layer but disposed within the substrate 1 at the surface of the substrate opposite the airbridge wiring layer 7. The conductive region 9 may be formed by any of numerous techniques, such as ion implantation, diffusion, or epitaxial growth. In this embodiment, since the first wiring layer is not disposed on the surface of the substrate 1 but is actually within that substrate 1, the air gap between that region 9 and the airbridge wiring layer 7 is increased. The increased air gap further reduces the capacitance of the airbridge wiring structure and further reduces the probability that, if the airbridge wiring layer 7 is broken, the airbridge wiring layer will come in contact with the conductive region 9. In the first embodiment, the electrically insulating protection layer is disposed on and conforms to the first wiring layer 8. That conforming protection layer can fracture at corners of the wiring layer 8. However, since, in this embodiment, there are no corners on the first wiring layer, the unillustrated insulating protection film is unlikely to crack or chip and provides more reliable prevention of short circuiting than in the prior art structure.

Figure 3:
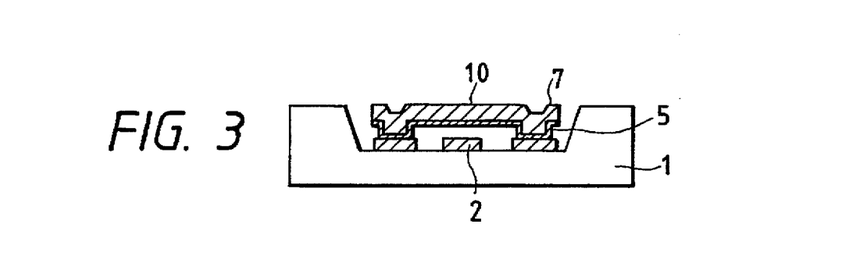
FIG. 3 is a sectional view of an airbridge wiring structure according to an embodiment of the invention.

FIG. 3 is a sectional view of still another airbridge wiring structure according to an embodiment of the invention. In this embodiment, the airbridge wiring layer 7 has a thickness of, for example, 3 to 5 micrometers and the first wiring layer 8 disposed on the surface of the substrate 1 has a thickness of about 2 microns. The airbridge wiring structure is arranged within a recess 10 in the substrate 1 having a depth of about 5 to 8 micrometers. The recess 10 is formed by etching the substrate 1. Since the airbridge wiring layer 7 is disposed within the recess 10, the airbridge wiring structure is located no higher than the surface of the non-recessed portion of the substrate 1. As a result, the non-recessed surface is likely to stop any object that might apply a mechanical force to the airbridge wiring layer 7. Therefore, the reliability of the airbridge wiring structure is improved.

Figure 4:
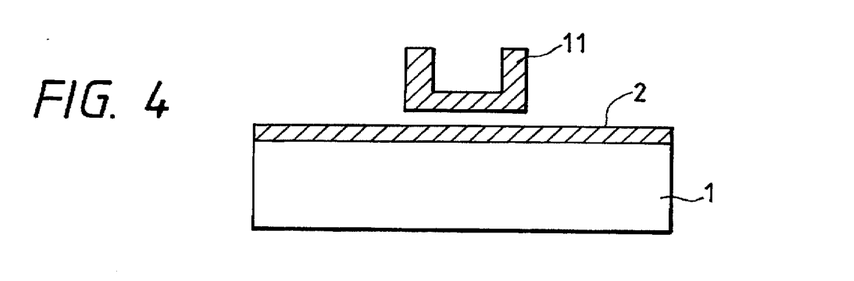
FIG. 4 is a sectional view of an airbridge wiring structure according to an embodiment of the invention.

FIG. 4 is a sectional view of an airbridge wiring structure according to another embodiment of the present invention. FIG. 4 is a sectional view taken along a line similar to line 1C—1C of FIG. 1A and line 2C—2C of FIG. 2A. The airbridge wiring structure of FIG. 4 differs from the airbridge wiring structures of FIGS. 1A, 2A, and 3 in that the airbridge wiring layer 11 has a U-shaped groove with the opening of the groove directed away from the substrate 1. This grooved structure resembles a structural beam and has increased strength against bending and breaking in response to external mechanical forces applied to the airbridge wiring layer 11 in the direction of the substrate 1.

Figure 5A:
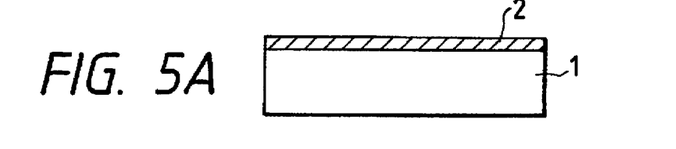
FIGS. 5A–5I are sectional views of steps in a method for manufacturing an airbridge wiring structure such as shown in FIG. 4.
Figure 5B:
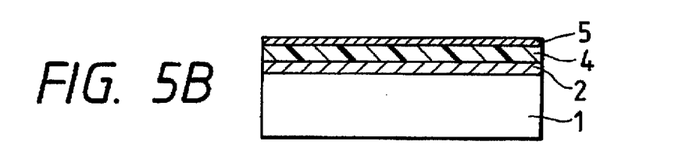
Figure 5C:
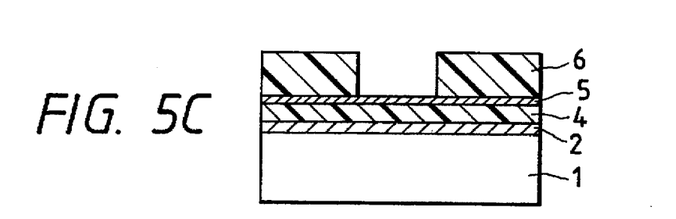
Figure 5D:
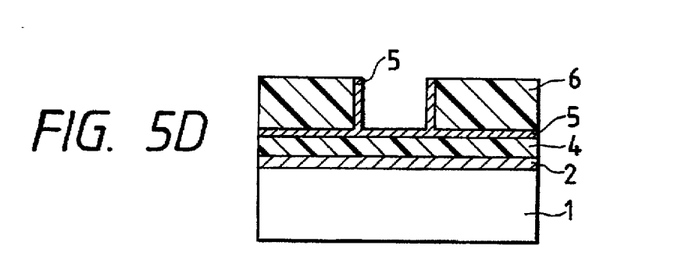
Figure 5E:
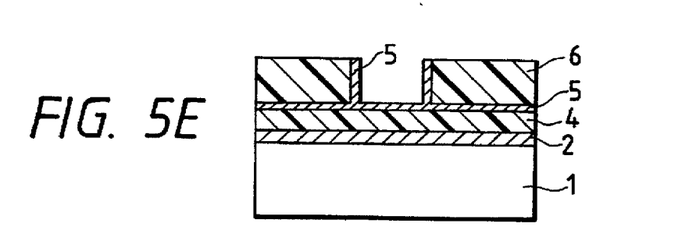
Figure 5F:
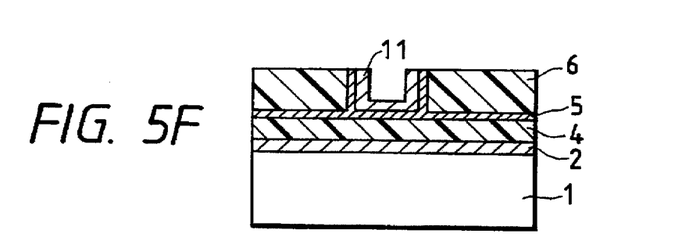
Figure 5G:
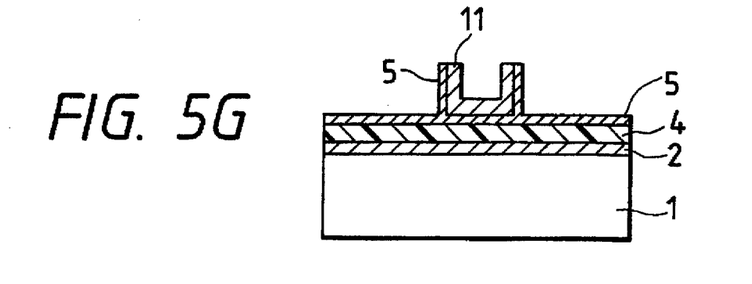
Figure 5H:
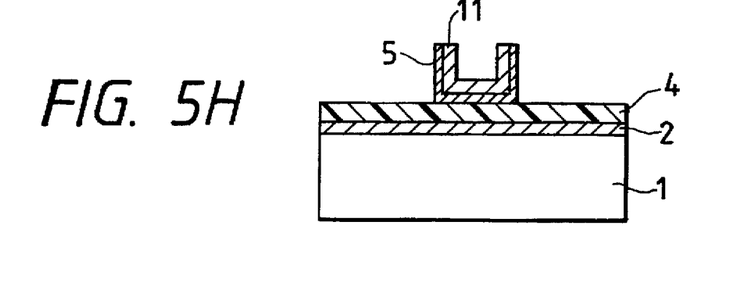
Figure 5I:
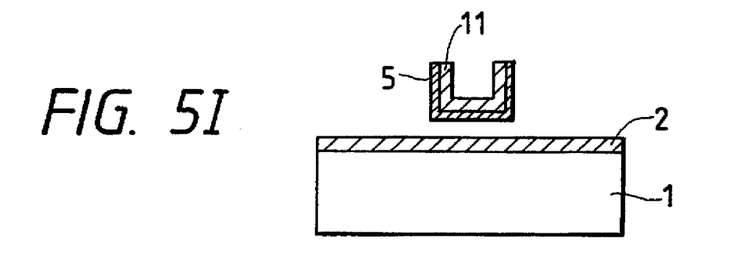

A method of manufacturing the airbridge wiring structure of FIG. 4 with a grooved airbridge wiring layer is illustrated in cross-sectional views in FIGS. 5A–5I. As in the conventional manufacturing method, a first wiring layer 2 is disposed on a substrate 1 (FIG. 5A). Subsequently, a first resist layer 4 and an electrically conducting feeding layer 5 of, for example, Ti/Au, are sequentially deposited on the first wiring layer 2, as shown in FIG. 5B. A second resist layer 6 is deposited and patterned to include an opening exposing parts of the feeding layer 5, as shown in FIG. 5C. The feeding layer is extended by depositing the same materials, for example, by sputtering, on the exposed part of the feeding layer 5 and the side walls of the opening of the second resist layer 6, producing the structure shown in FIG. 5D. The increased thickness of the feeding layer at the bottom of the opening may be removed by ion milling to improve the uniformity of the feeding layer, as shown in FIG. 5E. The feeding layer is used as an electrode in an electrolytic gold plating process and a relatively thick layer of gold, i.e., the airbridge wiring layer 11, is electrolytically deposited on the feeding layer, as illustrated in FIG. 5F. Thereafter, the second resist layer 6 is removed, as shown in FIG. 5G, and the unneeded portions of the feeding layer 5 are removed by ion milling to produce the structure of FIG. 5H. Finally, when the first resist layer 4 is removed, an air gap is left between the airbridge wiring layer 11 and the first wiring layer 2 so that the airbridge wiring layer 11 has the desired groove.

Figure 6:
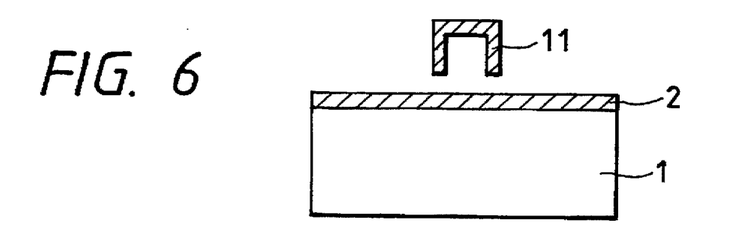
FIG. 6 is a sectional view of an airbridge wiring structure according to an embodiment of the invention.

FIG. 6 is a sectional view, similar to FIG. 4, of an airbridge wiring structure according to another embodiment of the invention. This airbridge wiring structure is essentially identical to the airbridge wiring structure of FIG. 4 except that the opening of the grooved airbridge wiring layer 11 is directed toward the substrate 1 rather than away from that substrate. The same improvement in mechanical strength is achieved by this grooved airbridge wiring layer as in the embodiment of FIG. 4.

Figure 7A:
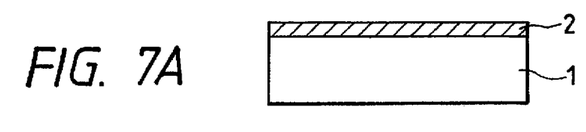
FIGS. 7A–7G are sectional views of steps in a method for manufacturing an airbridge wiring structure such as shown in FIG. 6.
Figure 7B:
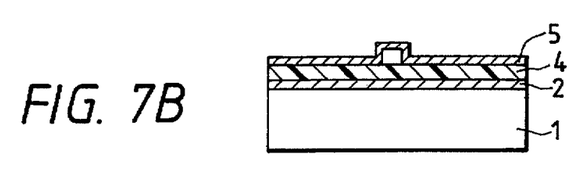
Figure 7C:
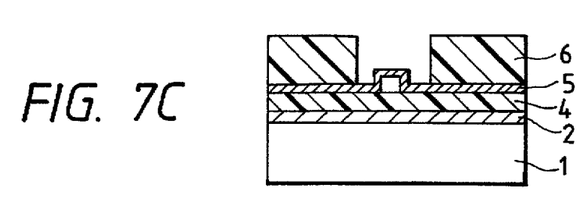
Figure 7D:
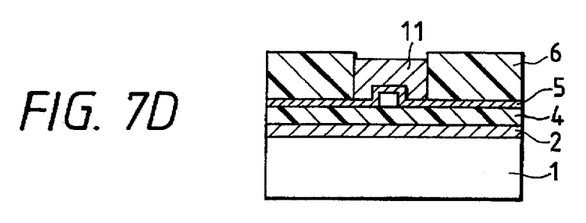
Figure 7E:
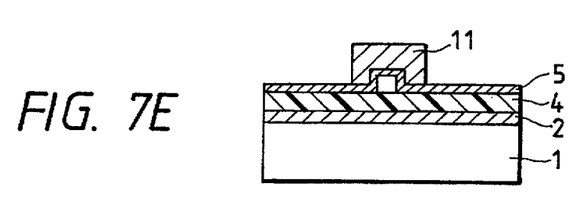
Figure 7F:
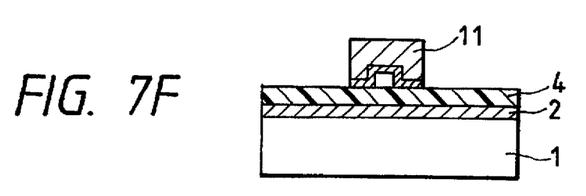
Figure 7G:
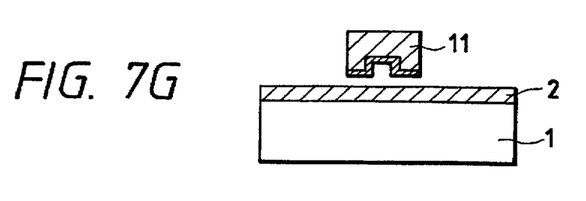

A method of making the airbridge wiring structure of FIG. 6 is illustrated in FIGS. 7A-7G. The step of FIG. 7A is identical to the step of FIG. 5A. After formation of the first wiring layer 2, a first resist layer 4 is deposited. In two photolithographic steps, that resist is patterned to include a central protrusion. Thereafter, as shown in FIG. 7B, the feeding layer 5 is deposited over the entire surface of the first resist layer 4. As in other embodiments, the feeding layer 5 may be sequentially deposited layers of Ti and Au. A second resist layer 6 is deposited to a thickness of about 10 micrometers and patterned to expose part of the feeding layer 5 including the central raised part. The resulting structure, shown in FIG. 7C, has a central part of the feeding layer exposed and the airbridge wiring layer 11 is an electrolytically plated gold layer formed on that exposed part of the feeding layer 5, as shown in FIG. 7D. Thereafter, the second resist layer 6 is removed, producing the structure shown in FIG. 7E. The unneeded parts of the feeding layer 5 are removed by ion milling, leaving the structure of FIG. 7F. Finally, the first resist layer 4 is removed, leaving the grooved airbridge wiring layer 11, as shown in FIG. 7G, with the opening of the groove directed toward the substrate 1.

Figure 8:
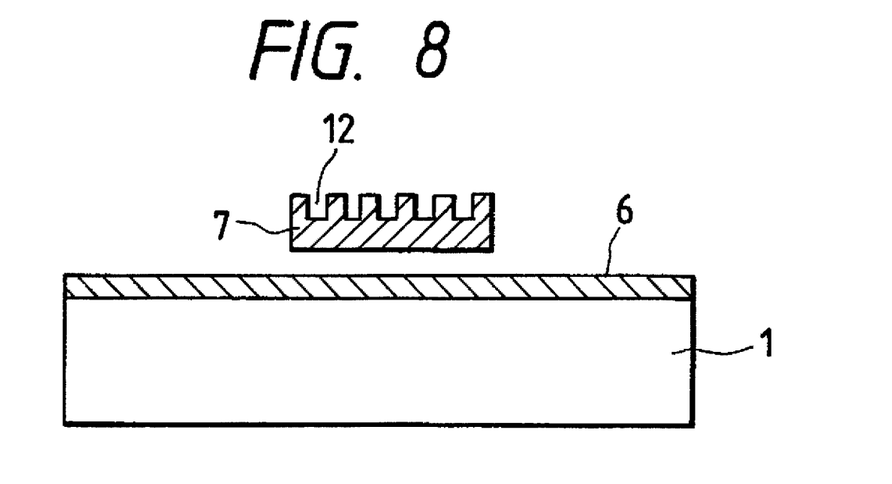
FIG. 8 is a sectional view of an airbridge wiring structure according to an embodiment of the invention.
Figure 9:
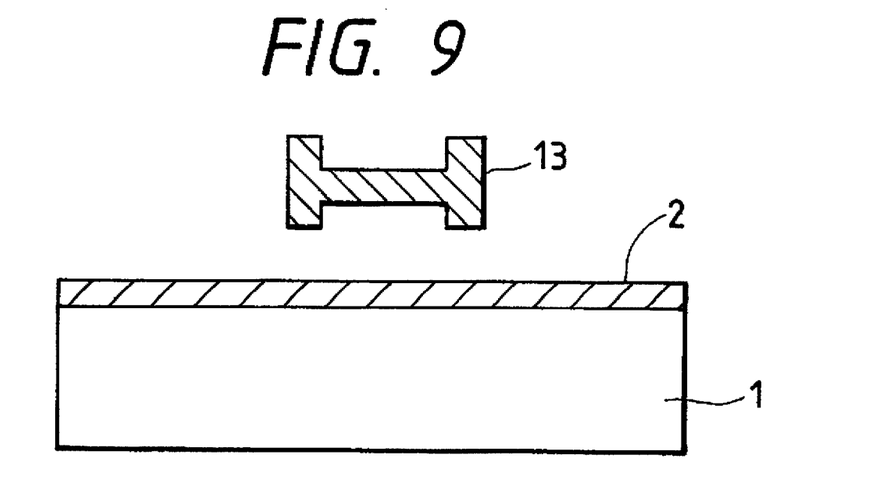
FIG. 9 is a sectional view of an airbridge wiring structure according to an embodiment of the invention.

FIGS. 8 and 9 are cross-sectional views, similar to FIGS. 4 and 6, illustrating other embodiments of the invention with different configuration airbridge wiring layers. In the embodiment of FIG. 8, the airbridge wiring layer 7 includes a plurality of grooves extending along a longitudinal direction of the airbridge wiring layer 7 and directed away from the substrate 1. These grooves may be formed by ion milling or etching. Just as with the single groove airbridge wiring layers, the airbridge wiring layer 7 with multiple grooves has improved mechanical strength for resisting deformation in response to externally applied forces and the weight of the airbridge wiring layer.

The embodiment of FIG. 9 includes an airbridge wiring layer 13 having opposed grooves, one groove facing the substrate 1 and one groove directed away from the substrate 1. In cross-section, the airbridge wiring layer has an H shape. As with the other grooved structures, increased mechanical strength is provided by this grooved airbridge wiring layer.

Figure 10A:
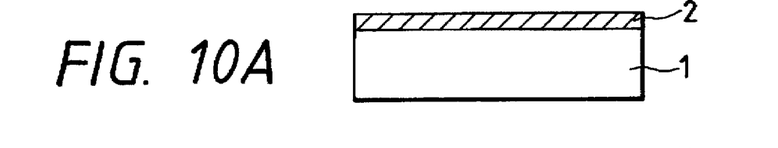
FIGS. 10A–10I are sectional views of steps in a method for manufacturing an airbridge wiring structure such as shown in FIG. 9.
Figure 10B:
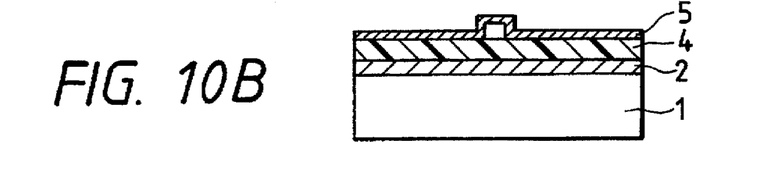
Figure 10C:
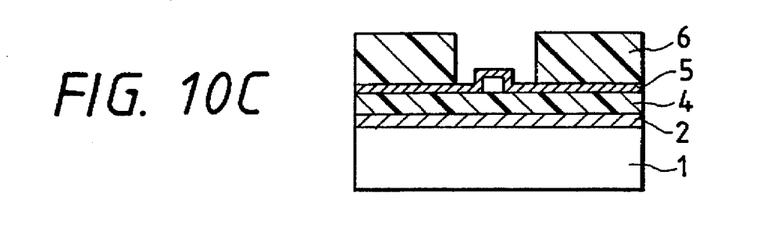
Figure 10D:
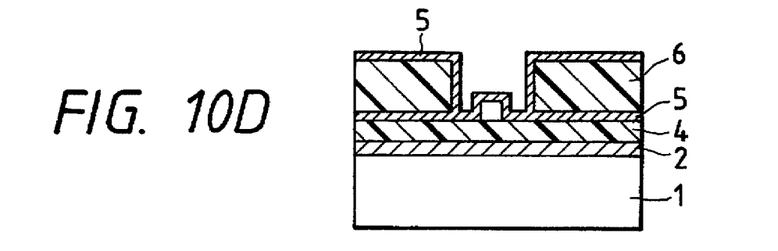
Figure 10E:
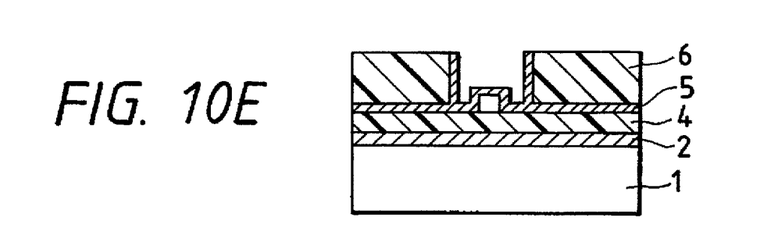
Figure 10F:
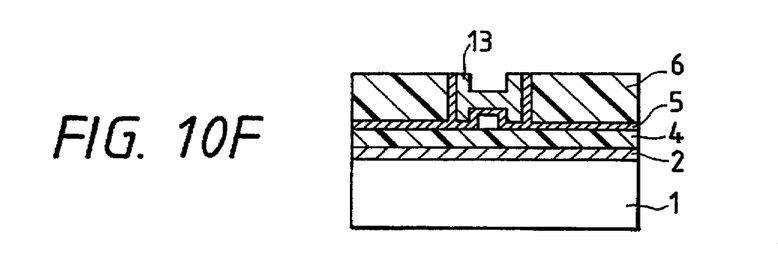
Figure 10G:
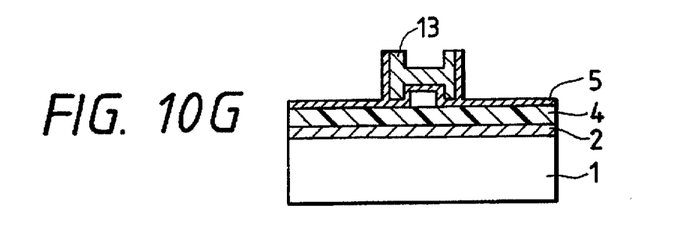
Figure 10H:
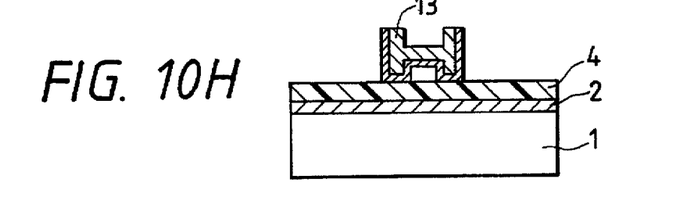
Figure 10I:
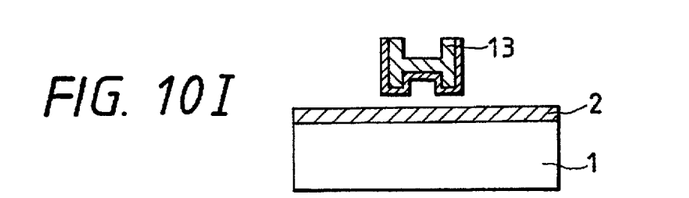

FIGS. 10A-10I illustrate steps in a method of manufacturing the airbridge wiring layer shown in FIG. 9. The steps of FIGS. 10A-10C are identical to those of FIGS. 7A-7C so that additional description of those steps is not necessary. As shown in FIG. 10D, the feeding layer 5 is further deposited by sputtering so that the layer is present on the side walls of the opening in the second resist layer 6 as well as on top of that second resist layer. As a result of this second deposition step, the feeding layer 5 is relatively thick at the bottom of the opening in the second resist layer 6. That additional thickness of the feeding layer 5 on the feeding layer 5 on top of the second resist layer 6 are removed by ion milling to produce the structure of FIG. 10E. Thereafter, the H-shaped airbridge wiring layer 13 is formed by electrolytically plating gold on the exposed parts of the feeding layer 5, as shown in FIG. 10F. The second resist layer 6 is removed, exposing other parts of the feeding layer 5 that are removed by ion milling (FIGS. 10G and 10H). Finally, the first resist layer 4 is removed, completing the airbridge wiring structure shown in FIG. 10I.

Figure 11:
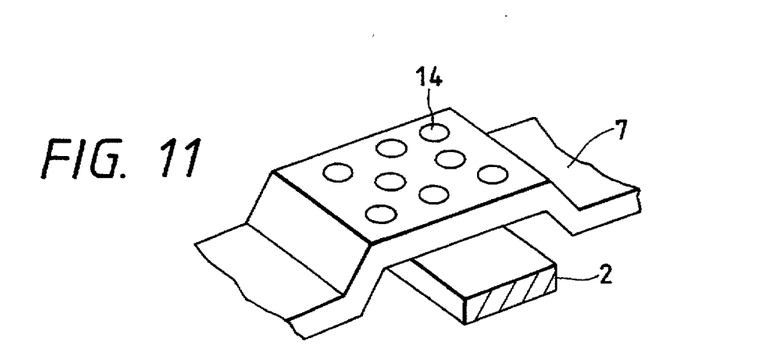
FIG. 11 is a sectional view of an airbridge wiring structure according to an embodiment of the invention.

Still another embodiment of an airbridge wiring structure according to the invention is shown in a perspective view in FIG. 11. In this embodiment, the airbridge wiring layer 7 includes a plurality of holes 14 in the airbridge wiring layer 7 directly opposite the first wiring layer 2. These holes 14 can be produced by ion milling. The holes 14 may penetrate through all or only part of the airbridge wiring layer 7. The holes 14 reduce the volume of the electrically conducting material in the airbridge wiring layer and increase the mechanical resistance of the airbridge wiring layer 7 to bending. Thus, this embodiment of the invention is particularly effective in reducing sagging of the airbridge wiring layer caused by its own weight.

In addition to the various structural arrangements for airbridge wiring layers described above, the mechanical strength of an airbridge wiring layer can be improved by ion implantation that hardens the material of that layer. For example, when the airbridge wiring layer is gold, copper ions may be implanted in order to harden the wiring layer.

Figure 13:
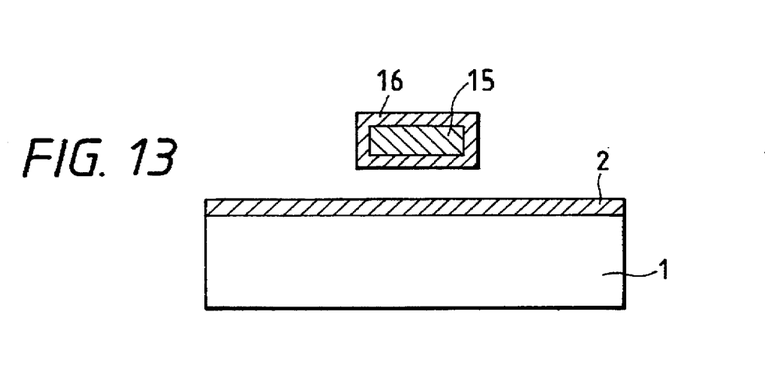
FIG. 13 is a sectional view of an airbridge wiring structure coated by a metal layer according to an embodiment of the invention.

In addition to the airbridge wiring structures described above, improved mechanical strength of an airbridge wiring layer can be achieved by laminating several different materials as the airbridge wiring layer 15. For example, a tantalum film 16 can be applied to a gold airbridge wiring layer in order to improve the overall mechanical strength of the resulting airbridge wiring structure as shown in FIG. 13.

I claim:

1. An airbridge wiring structure comprising:
   a substrate having a surface;
   a first wiring layer disposed on the surface of the substrate; and
   a second wiring layer disposed partially on the surface of the substrate and including an airbridge wiring layer crossing the first wiring layer, the first and second wiring layers being electrically insulated from each other and separated by an air gap wherein the first wiring layer is thinner opposite the airbridge wiring layer than elsewhere.

2. The airbridge wiring structure of claim 1 comprising an insulating layer disposed between the first wiring layer and the substrate.

3. The airbridge wiring structure of claim 1 wherein the first wiring layer is disposed at a position lower than the insulating layer.

4. The airbridge wiring structure of claim 1 wherein the airbridge wiring layer is gold in which copper ions are implanted for increasing the strength of the airbridge wiring layer.

5. The airbridge wiring structure of claim 1 wherein the airbridge wiring layer is laminated with a metal film for increasing the mechanical strength of the airbridge wiring layer.

6. The airbridge wiring structure of claim 5 wherein the metal film is tantalum.

7. An airbridge wiring structure comprising:
   a substrate having a first surface;
   a first wiring layer disposed on the first surface of the substrate; and
   a second wiring layer disposed partially on the first surface of the substrate and including an airbridge wiring layer crossing the first wiring layer, the first and second wiring layers being electrically insulated from each other and separated by an air gap wherein the substrate includes a recess in which the first surface is a bottom surface of the recess, and the substrate includes a second surface outside the recess, the recess providing protection to the air bridge wiring structure.

8. The airbridge wiring structure of claim 7 comprising an insulating layer disposed between the first wiring layer and the substrate.

9. The airbridge wiring structure of claim 7 wherein the airbridge wiring layer is gold in which copper ions are implanted for increasing the strength of the airbridge wiring layer.

10. The airbridge wiring structure of claim 7 wherein the airbridge wiring layer is laminated with a metal film for increasing the mechanical strength of the airbridge wiring layer.

11. The airbridge wiring structure of claim 10 wherein the metal film is tantalum.

12. An airbridge wiring structure comprising:

a substrate having a surface;

a first wiring layer disposed on the surface of the substrate; and a second wiring layer disposed partially on the surface of the substrate and including an airbridge wiring layer crossing the first wiring layer, the first and second wiring layers being electrically insulated from each other and separated by an air gap wherein the airbridge wiring layer includes at least one longitudinal groove transverse to the first wiring layer.

13. The airbridge wiring structure of claim 12 comprising an insulating layer disposed between the first wiring layer and the substrate.

14. The airbridge wiring structure of claim 12 wherein the groove includes an opening directed away from the substrate.

15. The airbridge wiring structure of claim 12 wherein the groove includes an opening directed toward the substrate.

16. The airbridge wiring structure of claim 12 wherein the airbridge wiring layer includes a plurality of longitudinal grooves.

17. The airbridge wiring structure of claim 12 wherein the airbridge wiring layer includes two oppositely directed longitudinal grooves.

18. The airbridge wiring structure of claim 12 wherein the airbridge wiring layer is gold in which copper ions are implanted for increasing the strength of the airbridge wiring layer.

19. The airbridge wiring structure of claim 12 wherein the airbridge wiring layer is laminated with a metal film for increasing the mechanical strength of the airbridge wiring layer.

20. The airbridge wiring structure of claim 19 wherein the metal film is tantalum.

21. An airbridge wiring structure comprising:

a substrate having a surface;

a first wiring layer disposed on the surface of the substrate; and a second wiring layer disposed partially on the surface of the substrate and including an airbridge wiring layer crossing the first wiring layer, the first and second wiring layers being electrically insulated from each other and separated by an air gap wherein the airbridge wiring layer includes a plurality of holes opposite the first wiring layer.

22. The airbridge wiring structure of claim 21 wherein the airbridge wiring layer is gold in which copper ions are implanted for increasing the strength of the airbridge wiring layer.

23. The airbridge wiring structure of claim 21 wherein the airbridge wiring layer is laminated with a metal film for increasing the mechanical strength of the airbridge wiring layer.

24. The airbridge wiring structure of claim 22 wherein the metal film is tantalum.

25. An airbridge wiring structure comprising:

a substrate having a surface;

a single electrically conducting region within a portion of and at the surface of the substrate and a first wiring layer having two parts disposed on the surface of the substrate, the two parts being electrically connected through the single electrically conducting region; and a second wiring layer partially disposed on the surface of the substrate and including an airbridge wiring layer crossing the single electrically conducting region wherein the single electrically conducting region and the airbridge wiring layer are electrically insulated from each other and separated by an air gap.

26. The airbridge wiring structure of claim 25 wherein the airbridge wiring layer is gold in which copper ions are implanted for increasing the strength of the airbridge wiring layer.

27. The airbridge wiring structure of claim 25 wherein the airbridge wiring layer is laminated with a metal film for increasing the mechanical strength of the airbridge wiring layer.

28. The airbridge wiring structure of claim 27 wherein the metal film is tantalum.

* * * * *

Disclaimer 5,677,574—Takayuki Hisaka, Itami, Japan. AIRBRIDGE WIRING STRUCTURE FOR MMIC. Patent dated Oct. 14, 1997. Disclaimer filed Nov. 3, 1997, by the assignee, Mitsubishi Denki Kabushiki Kaisha.

Hereby enters this disclaimer to cliams 12-20 of said patent.
*(Official Gazette,* January 13, 1998)